US012720880B2

(12) United States Patent
Fan et al.

(10) Patent No.: US 12,720,880 B2
(45) Date of Patent: Aug. 25, 2026

(54) METHOD FOR FORMING BACKSIDE ILLUMINATION CMOS IMAGE SENSOR

(71) Applicant: HUA HONG SEMICONDUCTOR (WUXI) LIMITED, Wuxi (CN)

(72) Inventors: Xiao Fan, Wuxi (CN); Han Wang, Wuxi (CN); Guanglong Chen, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 283 days.

(21) Appl. No.: 17/983,688

(22) Filed: Nov. 9, 2022

(65) Prior Publication Data

US 2023/0290805 A1 Sep. 14, 2023

(30) Foreign Application Priority Data

Mar. 8, 2022 (CN) ......................... 202210226990.5

(51) Int. Cl.

*H10F 39/00* (2025.01)
*H10F 39/12* (2025.01)
*H10F 39/18* (2025.01)

(52) U.S. Cl.

CPC ......... *H10F 39/014* (2025.01); *H10F 39/024* (2025.01); *H10F 39/028* (2025.01);

(Continued)

(58) Field of Classification Search

CPC .... H10F 39/014; H10F 39/028; H10F 39/024; H10F 39/807; H10F 39/80; H10F 39/199;

(Continued)

(56) References Cited

U.S. PATENT DOCUMENTS

2012/0033119 A1 2/2012 Shinohara
2013/0320419 A1 12/2013 JangJian et al.

(Continued)

FOREIGN PATENT DOCUMENTS

CN 104952896 A 9/2015
CN 104979370 A 10/2015

(Continued)

OTHER PUBLICATIONS

Chinese Office Action issued in Application No. 202210226990.5 on Sep. 17, 2025 (19 pages).

(Continued)

*Primary Examiner* — Matthew C Landau
*Assistant Examiner* — David W Ward
(74) *Attorney, Agent, or Firm* — Boyle Fredrickson, S.C.

(57) ABSTRACT

The present disclosure provides a method for forming a backside illumination CMOS image sensor, including: providing a first substrate having a first surface and a second surface opposite to each other; forming a photoelectric epitaxial layer on the second surface, wherein the photoelectric epitaxial layer has a third surface and a fourth surface opposite to each other, and the second surface is adjacent to the third surface, wherein the photoelectric epitaxial layer is includes a groove extending from the fourth surface to the third surface, and the photoelectric epitaxial layer includes a plurality of first doped areas and a plurality of second doped areas surrounding the plurality of first doped areas respectively; forming a device layer after forming the groove and the photoelectric epitaxial layer; and forming an isolation layer in the groove. The method can reduce generation of dark current and improve performance of the CMOS image sensor.

19 Claims, 8 Drawing Sheets

(52) U.S. Cl.
CPC ........... *H10F 39/807* (2025.01); *H10F 39/18* (2025.01); *H10F 39/199* (2025.01)

(58) Field of Classification Search
CPC ......... H01L 27/14692; H01L 27/14689; H01L 27/14621; H01L 27/14627; H01L 27/1463; H01L 27/14632; H01L 27/14636; H01L 27/1464; H01L 27/14643; H01L 27/14645; H01L 27/14685; H01L 27/14687; H01L 27/14698
See application file for complete search history.

(56) References Cited

U.S. PATENT DOCUMENTS

2016/0284746 A1* 9/2016 Fukase .............. H10F 39/80373
2016/0351604 A1 12/2016 Kalnitsky et al.
2017/0365631 A1* 12/2017 Iizuka ............... H01L 27/14612
2020/0127025 A1 4/2020 Lim et al.
2021/0335861 A1* 10/2021 Cheng ................. H01L 27/1469
2022/0367535 A1* 11/2022 Cheng ............... H01L 21/76232

FOREIGN PATENT DOCUMENTS

CN 105826331 A 8/2016
CN 109065565 A 12/2018
CN 112992948 A 6/2021
CN 114141799 A 3/2022
JP 2016082067 A 5/2016
KR 20070034884 A 3/2007

OTHER PUBLICATIONS

Chinese Office Action issued in Application No. 202210226990.5 on Feb. 11, 2026 (19 pages).
Chinese Rejection Notification issued in Application No. 202210226990.5 on May 28, 2026.

* cited by examiner

METHOD FOR FORMING BACKSIDE ILLUMINATION CMOS IMAGE SENSOR

CROSS-REFERENCE TO RELATED APPLICATIONS

This application claims the benefit of priority to Chinese patent application No. 202210226990.5, filed on Mar. 8, 2022, the entire disclosures of which are incorporated herein by reference.

TECHNICAL FIELD

The present disclosure relates to the technical field of semiconductors, and more particularly to a method for forming a backside illumination CMOS image sensor.

BACKGROUND OF THE INVENTION

Image sensor is a device for converting optical signals into electrical signals, which is widely used in digital televisions and visual communication products. A CMOS image sensor is made by traditional CMOS circuit technology, which can integrate the image sensor and its required peripheral circuits, thus making the CMOS image sensor have a broad application prospect.

According to different positions of received light, the CMOS image sensor can be divided into two structures: Frontside Illumination (FSI) and Backside Illumination (BSI). Compared with a frontside illumination image sensor, a backside illumination image sensor can change an internal structure of an element, that is, change a direction of incident light path of an element of a photosensitive layer, so that the light can directly enter the element from a back side, which can avoid an influence of a structure and thickness between a microlens and a photodiode on the light in the frontside illumination image sensor, and improve a reception efficiency of optical fibers. With the development of image sensing technology, the backside illumination CMOS image sensor technology is gradually becoming the mainstream technology of mid and high-end CMOS image sensors.

However, the manufacturing process of the backside illumination CMOS image sensor involves a front side and back side of a wafer, which is more complex than that of the frontside illumination CMOS image sensor. Thus, the existing method for forming the backside illumination CMOS image sensor needs to be further improved.

SUMMARY OF THE INVENTION

The present disclosure provides a method for forming a backside illumination CMOS image sensor to improve the performance of the formed backside illumination CMOS image sensor.

According to an aspect of the present disclosure, a method for forming a backside illumination CMOS image sensor includes: providing a first substrate, wherein the first substrate has a first surface and a second surface opposite to each other; forming a photoelectric epitaxial layer on the second surface, wherein the photoelectric epitaxial layer has a third surface and a fourth surface opposite to each other, and the second surface is adjacent to the third surface, wherein the photoelectric epitaxial layer includes a groove extending from the fourth surface to the third surface, and the photoelectric epitaxial layer comprises a plurality of first doped areas and a plurality of second doped areas surrounding the plurality of first doped areas respectively; forming a device layer after forming the groove and the photoelectric epitaxial layer; and forming an isolation layer in the groove.

According to some embodiments, the method further includes: providing a second substrate and a third substrate; disposing the fourth surface to face the second substrate and bonding the photoelectric epitaxial layer and the second substrate after forming the groove and the photoelectric epitaxial layer and before forming the device layer; disposing the third surface to face the third substrate and bonding the photoelectric epitaxial layer and the third substrate after forming the device layer; removing the second substrate to expose the fourth surface after bonding the photoelectric epitaxial layer and the third substrate; and forming a filter layer on the fourth surface and the isolation layer and a plurality of lenses on a surface of the filter layer after exposing the fourth surface.

According to some embodiments, forming the photoelectric epitaxial layer and the groove comprises: forming an initial doped layer on the second surface, wherein the initial doped layer comprises a first doped material layer, a second doped material layer on the first doped material layer and a third doped material layer on the second doped material layer, the first doped material layer and the third doped material layer have a first conductive type, and the second doped material layer has a second conductive type different from the first conductive type; etching the initial doped layer until the first doped material layer is exposed to form an initial groove in the initial doped layer and to form the plurality of first doped areas by the second doped material layer; and forming a doped epitaxial layer on a side wall and a bottom surface of the initial groove to form the groove by the initial groove and to form the plurality of second doped areas by the doped epitaxial layer, the first doped material layer and the third doped material layer.

According to some embodiments, the doped epitaxial layer is formed by an epitaxial growth process.

According to some embodiments, a material of the doped epitaxial layer has doping ions, and a conductive type of the doping ions is the same as a conductive type of the second doped material layer.

According to some embodiments, the initial groove is formed by a dry etching process.

According to some embodiments, forming the initial groove includes: forming a mask layer on a surface of the initial doped layer from which a part of the initial doped layer is exposed, and etching the initial doped layer with the mask layer as a mask.

According to some embodiments, the mask layer is made of a material including a photoresist or a dielectric material, and the dielectric material includes one or more selected from a group consisting of silicon oxide, silicon nitride, silicon oxynitride, silicon oxycarbide, silicon carbonitride, and silicon oxycarbonitride.

According to some embodiments, the initial groove is formed by a thermal annealing process after the dry etching process.

According to some embodiments, the method further includes: performing an oxidizing process on the side wall and the bottom surface of the initial groove to form a thin oxygen layer after forming the initial groove and before forming the doped epitaxial layer.

According to some embodiments, bonding the photoelectric epitaxial layer and the second substrate includes: forming a buffer layer on a surface of the second substrate; and disposing the fourth surface to face a surface of the buffer layer of the second substrate and bonding the photoelectric epitaxial layer and the second substrate.

According to some embodiments, the buffer layer is made of silicon oxide or silicon nitride.

According to some embodiments, the method further includes: performing a thinning process on the first substrate and the photoelectric epitaxial layer from the first surface after bonding the photoelectric epitaxial layer and the second substrate and before forming the device layer.

According to some embodiments, the thinning process includes one or more selected from a group consisting of a chemical wet etching process and a chemical mechanical grinding process.

According to some embodiments, the thinning process is performed on the first substrate and the photoelectric epitaxial layer from the first surface until the photoelectric epitaxial layer is exposed, and a thickness of the photoelectric epitaxial layer ranges from 2 μm to 6 μm.

According to some embodiments, a depth of the groove in a normal direction of a surface of the first substrate ranges from 0.5 μm to 3 μm, and a width of the groove in a direction parallel to the surface of the first substrate ranges from 0.1 μm to 1 μm.

According to some embodiments, removing the second substrate includes one or more selected from a group consisting of a chemical wet etching process and a chemical mechanical grinding process.

According to some embodiments, the device layer includes one or more selected from a group consisting of an active device, a passive device, an electrical interconnection structure, and a dielectric layer.

According to some embodiments, a surface of the electrical interconnection structure is exposed from a surface of the device layer, and the method further include: forming a dielectric material layer on the surface of the electric interconnection structure and flattening the dielectric material layer by a chemical mechanical grinding process before bonding the photoelectric epitaxial layer and the third substrate.

According to some embodiments, the method further includes: aligning the device layer and the groove in relative positions before forming the device layer on the third surface.

According to some embodiments, the photoelectric epitaxial layer includes a first area and a second area, the groove is disposed in the first area, and the method further includes: forming a peripheral device on the third surface in the second area.

Compared with the conventional technology, the technical solution of the embodiment of the present disclosure has following beneficial effects:

In the method for forming the backside illumination CMOS image sensor according to the present disclosure, on the one hand, the photoelectric epitaxial layer is formed on the first substrate, and the photoelectric epitaxial layer includes the groove, the groove extends from the second surface to the first surface, and the photoelectric epitaxial layer includes the plurality of first doped areas and the plurality of second doped areas surrounding the plurality of first doped areas respectively, thus a photodiode formed by the photoelectric epitaxial layer adopts a structure in which the plurality of second doped areas encloses the plurality of first doped areas respectively, which can improve the performance of the photodiode in the formed device; on the other hand, the device layer is formed on the first surface after forming the groove and the photoelectric epitaxial layer, thus the groove is formed before the device layer is formed, and thus subsequent high-temperature process (such as formation process of a source drain layer) after the groove is formed can reduce the damage caused by an etching process of the groove. The formation process of the groove can also include a high-temperature thermal annealing process, in order to reduce the damage caused by the etching process of the groove, thereby reducing the generation of dark current of the device, and improving the performance of the formed backside illumination CMOS image sensor.

Further, in the method for forming the photoelectric epitaxial layer and the groove, the doped epitaxial layer is formed on the side wall and bottom surface of the initial groove, so as to form the groove by the initial groove and to form the second doped area by the doped epitaxial layer, the first doped material layer and the third doped material layer. The plurality of first doped areas and the plurality of second doped areas can be formed by an epitaxial growth process, and the doping ions in the first doped areas and the second doped areas can be doped and formed in the epitaxial growth process, thus ion concentration distribution in the first doped areas and the second doped areas is uniform, which is conducive to the formation of stable photodiodes.

DETAILED DESCRIPTION OF THE EMBODIMENTS

It should be noted that “on a surface” in this specification is used to describe relative position of space, and is not limited to define two elements which are directly in contact with each other.

As described in the background, the existing method for forming the backside illumination CMOS image sensor needs to be further improved. The structure of a backside illumination CMOS image sensor will be described and analyzed.

Figure 1:
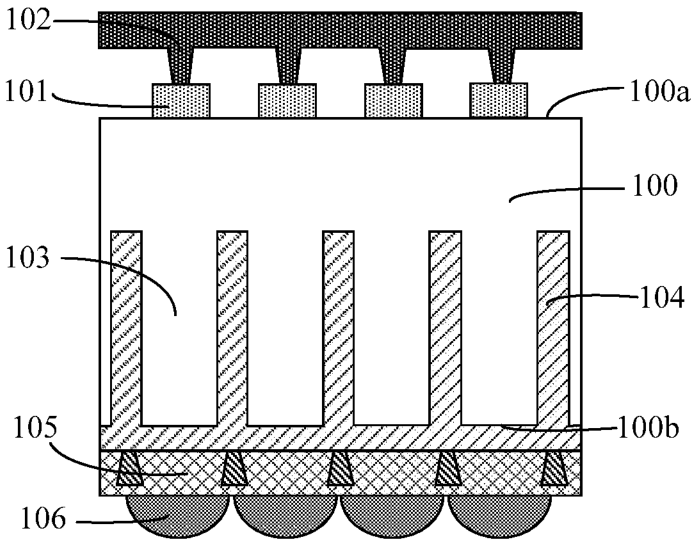
FIG. 1 is a structural schematic view showing a backside illumination CMOS image sensor.

FIG. 1 is a structural schematic view showing a backside illumination CMOS image sensor.

Referring to FIG. 1, the CMOS image sensor includes: a substrate 100 including a first surface 100*a* and a second surface 100*b* opposite to each other, a device layer 101 on the first surface 100*a*, a metal layer 102 on the device layer 101, a plurality of photodiode areas 103 in the substrate 100, a deep groove (not shown in the figure) disposed between adjacent photodiode areas 103 and extending from the second surface 100*b* to the first surface 100*a*, an isolation layer 104 on the second surface 100*b* and in the deep groove, a filter layer 105 on the isolation layer 104 and a plurality of lenses 106 on a surface of the filter layer 105.

The method for forming the backside illumination CMOS image sensor includes: forming the device layer 101 and the metal layer 102 on the first surface 100*a*; bonding a second substrate (not shown in the figure) to the metal layer 102 by a silicon wafer bonding process; performing a thinning process from the second surface 100*b* of the substrate 100 after the bonding process; forming the deep groove in the second surface 100*b* after the thinning process; forming the isolation layer 104 on the second surface 100*b* and in the deep groove; and forming the filter layer 105 and the plurality of lenses 106 on the surface of the filter layer 105. In the method, the deep groove is formed by a dry etching process. In order to avoid the impact on the device layer 101 and the metal layer 102 on the first surface 100*a*, the process temperature of forming the deep groove needs to be controlled below 400 degrees Celsius. However, the damage on the silicon surface caused by the dry etching process cannot be effectively recovered at low temperatures. Plasma induced damage (PID) is an important reason for the formation of dark current, which can seriously affect the performance of the backside illumination CMOS image sensor.

In the method for forming the backside illumination CMOS image sensor according to the present disclosure, on the one hand, the photoelectric epitaxial layer is formed on the first substrate, and the photoelectric epitaxial layer includes the groove, the groove extends from the second surface to the first surface, and the photoelectric epitaxial layer includes the plurality of first doped areas and the plurality of second doped areas surrounding the plurality of first doped areas respectively, thus a photodiode formed by the photoelectric epitaxial layer adopts a structure in which the plurality of second doped areas encloses the plurality of first doped areas respectively, which can improve the performance of the photodiode in the formed device; on the other hand, the device layer is formed on the first surface after forming the groove and the photoelectric epitaxial layer, thus the groove is formed before the device layer is formed, and thus subsequent high-temperature process (such as formation process of a source drain layer) after the groove is formed can reduce the damage caused by an etching process of the groove. The formation process of the groove can also include a high-temperature thermal annealing process, in order to reduce the damage caused by the etching process of the groove, thereby reducing the generation of dark current of the device, and improving the performance of the formed backside illumination CMOS image sensor.

In order to make above purposes, features and beneficial effects of the present disclosure more obvious and understandable, specific embodiments of the present disclosure are described in detail below in combination with the accompanying drawings.

FIGS. 2 to 11 are structural schematic views showing each step of a method for forming a backside illumination CMOS image sensor according to an embodiment of the present disclosure.

Figure 2:
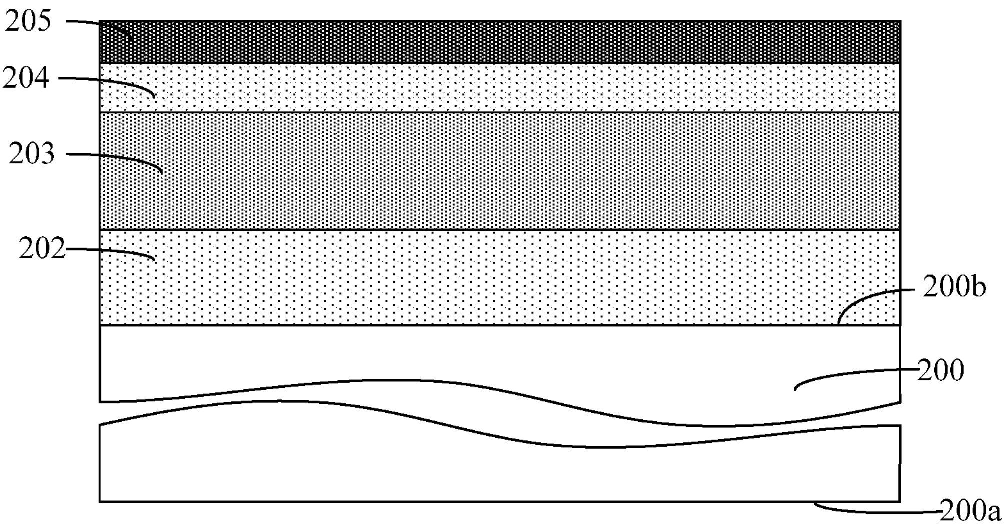
FIGS. 2 to 11 are structural schematic views showing each step of a method of forming a backside illumination CMOS image sensor according to an embodiment of the present disclosure.

Referring to FIG. 2, a first substrate 200 is provided, and the first substrate 200 includes a first surface 200*a* and a second surface 200*b*.

In some embodiments, the material of the first substrate 200 includes silicon. In other embodiments, the material of the first substrate includes silicon carbide, silicon germanium, multicomponent semiconductor materials composed of group III-V elements, silicon on insulator (SOI) or germanium on insulator. The multicomponent semiconductor materials composed of group III-V elements include InP, GaAs, GaP, InAs, InSb, InGaAs or InGaAsP.

In some embodiments, a second substrate and a third substrate are also provided. The second substrate and the third substrate are used as supports in the process.

Figure 3:
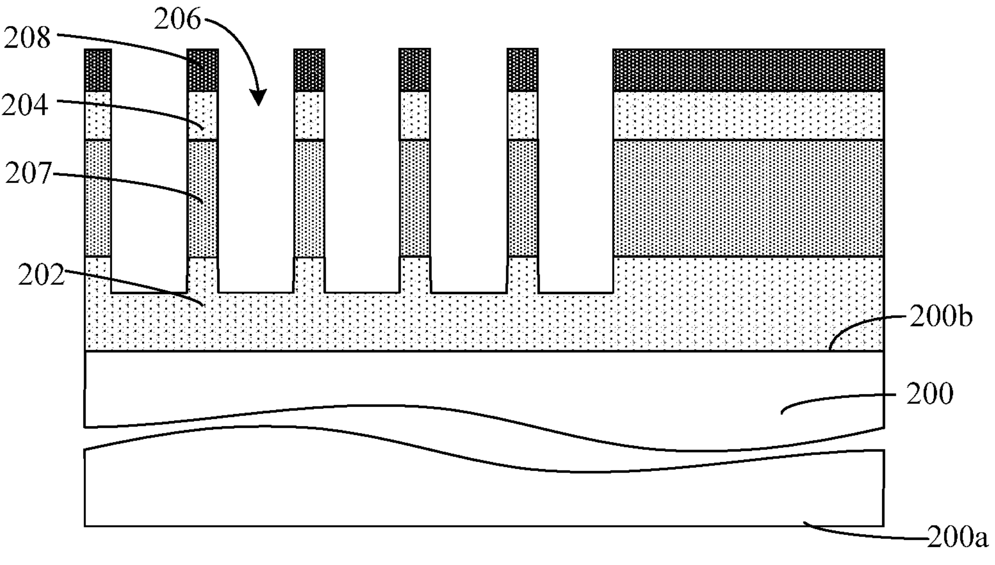
Figure 4:
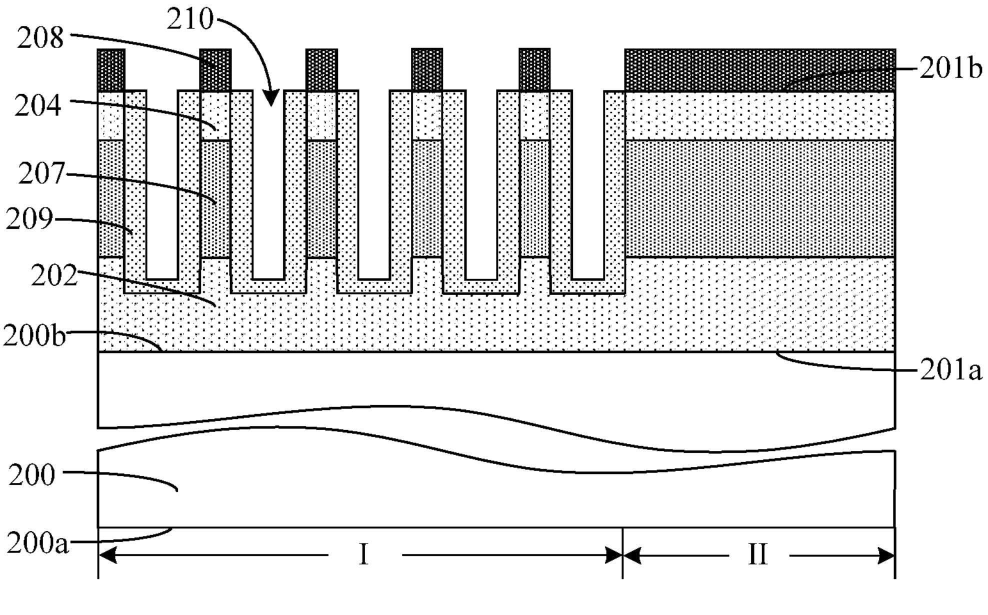

Subsequently, a photoelectric epitaxial layer is formed on the second surface 200*b*. The photoelectric epitaxial layer has a third surface and a fourth surface opposite to each other. The second surface is adjacent to the third surface. A groove is formed in the photoelectric epitaxial layer. The groove extends from the fourth surface to the third surface. The photoelectric epitaxial layer includes a plurality of first doped areas and a plurality of second doped areas surrounding the plurality of first doped areas respectively. In some embodiments, the method for forming the photoelectric epitaxial layer and the groove is shown in FIGS. 2 to 4.

Still referring to FIG. 2, an initial doped layer is formed on the second surface 200*b*. The initial doped layer includes a first doped material layer 202, a second doped material layer 203 on the first doped material layer 202, and a third doped material layer 204 on the second doped material layer 203. The first doped material layer 202 and the third doped material layer 204 have a first conductive type, the second doped material layer 203 has a second conductive type, and the first conductive type is different from the second conductive type. The initial doped layer may be used for forming the photoelectric epitaxial layer.

In some embodiments, the first conductive type may be P-type, and the second conductive type may be N-type. In other embodiments, the first conductive type may be N-type, and the second conductive type may be P-type.

In some embodiments, before forming the photoelectric epitaxial layer, a mask material layer 205 is also formed on the initial doped layer. The mask material layer 205 may be used to form a mask layer.

The material of the mask material layer 205 may include a photoresist or a dielectric material, and the dielectric material includes one or more selected from a group consisting of silicon oxide, silicon nitride, silicon oxynitride, silicon oxycarbide, silicon carbonitride and silicon oxycarbonitride. For example, the material of the mask material layer 205 is silicon oxide.

Referring to FIG. 3, the initial doped layer is etched until the first doped material layer 202 is exposed, so that an initial groove 206 is formed in the initial doped layer, and a plurality of first doped areas 207 are formed by the second doped material layer 203.

The forming process of the initial groove 206 includes a dry etching process.

Subsequently, a doped epitaxial layer is formed on the side wall and bottom surface of the initial groove 206 to form the groove by the initial groove. After the groove and the photoelectric epitaxial layer are formed, a device layer is formed on the first surface. The formation process of the groove is completed before the formation process of the device layer. More specifically, the initial groove 206 is formed before the forming process of the device layer. Thus, the subsequent high-temperature process (such as the forming process of a source drain layer) for forming the initial groove 206 can reduce the damage caused by the etching process of the initial groove 206. The forming process of the initial groove 206 can also include a high-temperature thermal annealing process to reduce the damage caused by the etching process of the initial groove 206. Thus, the generation of dark current can reduced, and the performance of the backside illumination CMOS image sensor can be improved.

The forming process of the initial groove 206 can also include a thermal annealing process after the dry etching process.

The forming method of the initial groove 206 includes: forming a mask layer 208 on a surface of the initial doped layer from which a part of the initial doped layer is exposed, and etching the initial doped layer with the mask layer 208 as a mask.

The forming method of the mask layer 208 includes: patterning the mask material layer 205.

The material of the mask layer 208 may include a photoresist or a dielectric material, and the dielectric material includes one or more selected from a group consisting of silicon oxide, silicon nitride, silicon oxynitride, silicon oxycarbide, silicon carbonitride and silicon oxycarbonitride. For example, the material of the mask layer 208 is silicon oxide.

The mask layer 208 may be used as a mask to form the initial groove 206. In some embodiments, the mask layer 208 is not removed after the initial groove 206 is formed. In other embodiments, the mask layer 208 may be removed after the initial groove 206 is formed.

In other embodiments, after the initial groove is formed and before the doped epitaxial layer is formed, an oxidizing process is also performed on the side wall and bottom surface of the initial groove to form a thin oxygen layer. The thin oxygen layer is helpful to reduce the damage of the surface of the initial groove in the dry etching process.

Referring to FIG. 4, a doped epitaxial layer 209 is formed on the side wall and bottom surface of the initial groove 206, so that the groove 210 is formed by the initial groove 206, and the second doped area is formed by the doped epitaxial layer 209, the first doped material layer 202 and the third doped material layer 204.

The photoelectric epitaxial layer has a third surface 201*a* and a fourth surface 201*b*, and the second surface 200*b* is adjacent to the third surface 201*a*. The photoelectric epitaxial layer includes a plurality of first doped areas 207 and a plurality of second doped areas surrounding the plurality of first doped areas 207 respectively. A photodiode formed by the photoelectric epitaxial layer adopts a structure in which each second doped area encloses each first doped area 207, which can improve the performance of the photodiode in the formed device.

In some embodiments, the photoelectric epitaxial layer includes a first area I and a second area II. The first area I may be used to form an image sensor pixel area, and the second area II may be used to form a peripheral device. Specifically, the peripheral device is formed on the third surface 201*a* in the second area II.

A depth of the groove 210 in a direction normal to a surface of the first substrate 200 ranges from 0.5 μm to 3 μm, and a width of the groove 210 in a direction parallel to the surface of the first substrate 200 ranges from 0.1 μm to 1 μm.

The formation process of the doped epitaxial layer 209 includes an epitaxial growth process.

In some embodiments, the material of the doped epitaxial layer 209 has doping ions, and a conductive type of the doping ions is the same as that of the second doped material layer. Specifically, the conductive type of the doping ions may be P-type. In other embodiments, the material of the doped epitaxial layer 209 can be an intrinsic material of silicon, that is, there are no doping ions.

The second doped area is formed by the doped epitaxial layer 209, the first doped material layer 202 and the third doped material layer 204. The first doped areas 207 and the second doped areas are all formed by an epitaxial growth process. The doping ions in the first doped areas 207 and the second doped areas can be doped and formed in the epitaxial growth process, thus the ion concentration in the first doped areas 207 and the second doped areas is uniformly distributed, which is conducive to the formation of stable photodiodes.

Figure 5:
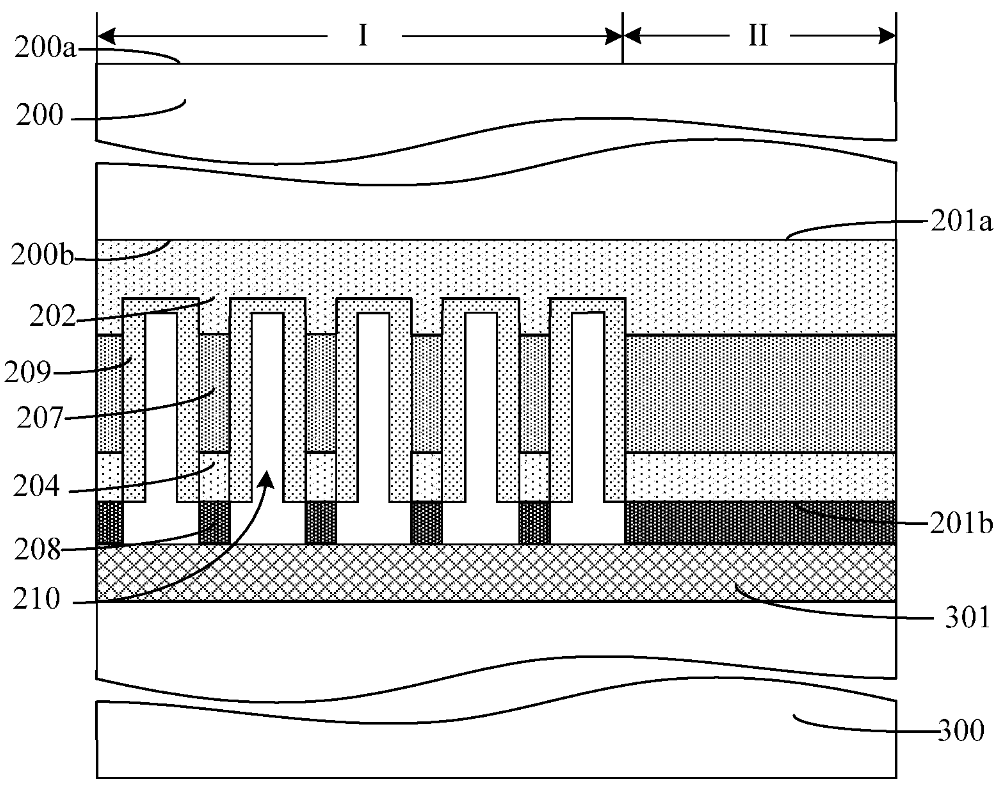
Figure 6:
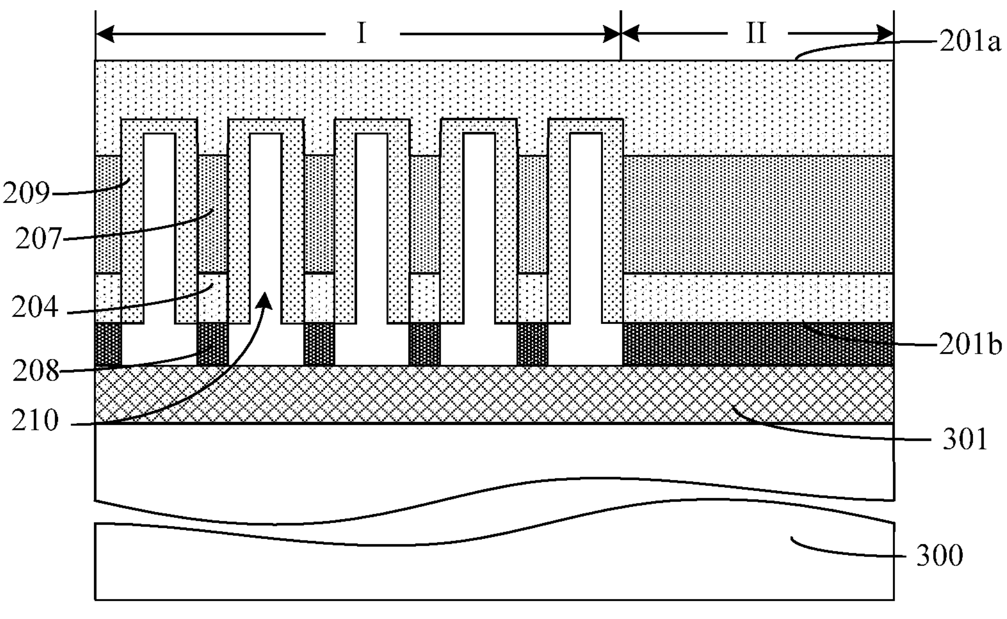

Subsequently, after the groove 210 and the photoelectric epitaxial layer are formed, a device layer is formed on the third surface 201*a*, as shown in FIGS. 5 to 6.

Referring to FIG. 5, the fourth surface 201*b* is disposed to face the second substrate 300, and the photoelectric epitaxial layer is boned to the second substrate 300.

In some embodiments, the method for bonding the photoelectric epitaxial layer and the second substrate 300 includes: forming a buffer layer 301 on a surface of the second substrate 300, and disposing the fourth side 201*b* to face a surface of the buffer layer 301 of the second substrate 300, and bonding the photoelectric epitaxial layer and the second substrate 300.

The material of the buffer layer 301 includes silicon oxide or silicon nitride. In some embodiments, the material of the buffer layer 301 includes silicon oxide.

Referring to FIG. 6, after bonding the photoelectric epitaxial layer and the second substrate 300, and before forming the device layer, the method also includes: performing a thinning process on the first substrate 200 and the photoelectric epitaxial layer from the first side 200*a*.

The thinning process includes one or more selected from a group consisting of a chemical wet etching process and a chemical mechanical grinding process.

Specifically, the thinning process is performed on the first substrate 200 and the photoelectric epitaxial layer from the first side 200*a* until the photoelectric epitaxial layer is exposed, and a thickness of the photoelectric epitaxial layer ranges from 2 μm to 6 μm. The thickness of the photoelectric epitaxial layer may be determined according to actual needs.

Figure 7:
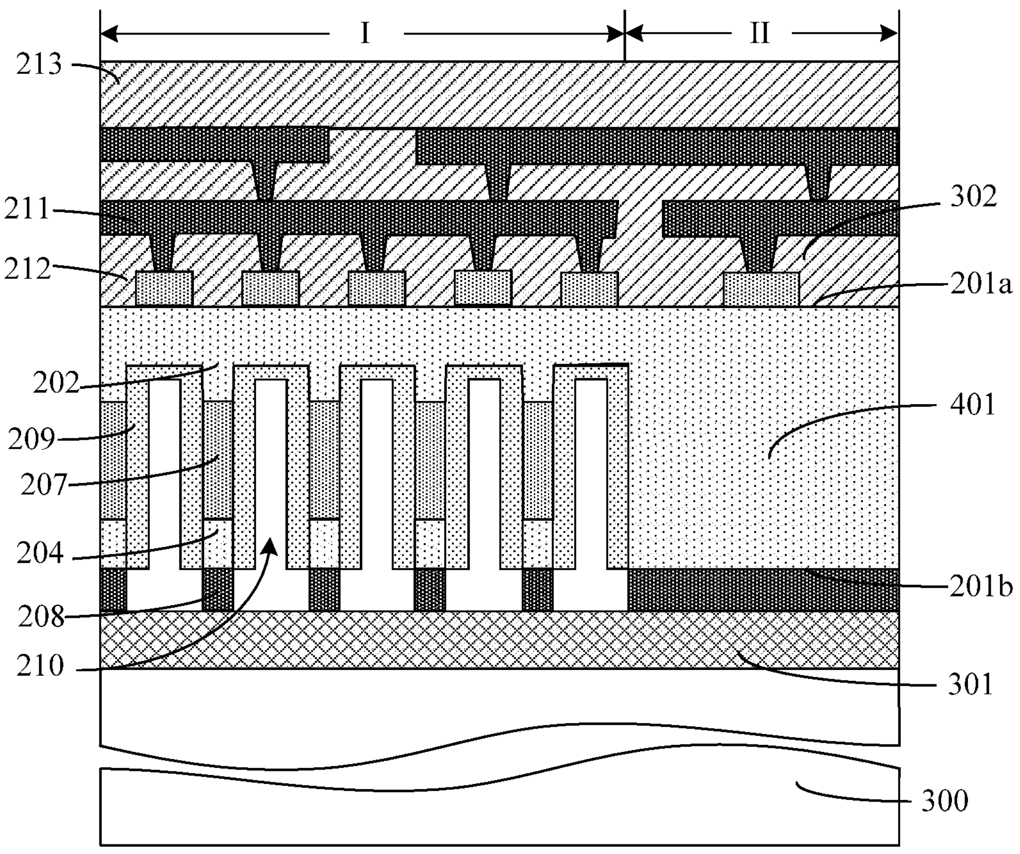

Referring to FIG. 7, after the groove 210 and the photoelectric epitaxial layer are formed, a device layer is formed on the third surface 201*a*.

In some embodiments, specifically, after the thinning process is performed on the first substrate 200 and the photoelectric epitaxial layer from the first side 200*a*, a device layer is formed on the third surface 201*a*.

In some embodiments, before forming the device layer, doping ions are also injected into the second area II from the third surface 201*a*. The conductive type of the doping ions is opposite to that of the second doping material layer 203, and a well 401 is formed in the second area II. More specifically, the conductive type of the doping ions is P-type. In other embodiments, corresponding doping can be performed according to actual needs of peripheral devices.

Before the device layer is formed on the third surface 201*a*, the device layer is aligned with the groove 201 in relative positions.

The device layer includes one or more of an active device (not shown in the figure), a passive device (not shown in the figure), an electrical interconnection structure 211, and a dielectric layer 212. The device type and device structure in the device layer are formed according to actual needs.

Specifically, the device layer is disposed in the first area I. In some embodiments, a peripheral device layer 302 is also formed on the third surface 201*a* in the second area II, and the peripheral device layer 302 is electrically coupled with the electrical interconnection structure 211 in the device layer.

In some embodiments, a surface of the electrical interconnection structure 211 is exposed from a surface of the device layer. Specifically, the interconnection structure 211 is disposed in the dielectric layer 212, and the surface of the interconnection structure 211 is exposed.

Subsequently, the third side 201*a* is disposed to face the third substrate, and the photoelectric epitaxial layer is boned to the third substrate.

In some embodiments, before bonding the photoelectric epitaxial layer and the third substrate, the method also includes: forming a dielectric material layer 213 on the surface of the electrical interconnection structure 202; and flattening the dielectric material layer 213 by a chemical mechanical grinding process.

The dielectric material layer 213 is conducive to the bonding between the photoelectric epitaxial layer and the third substrate, and the chemical mechanical grinding process can improve the bonding performance between the photoelectric epitaxial layer and the third substrate.

Figure 8:
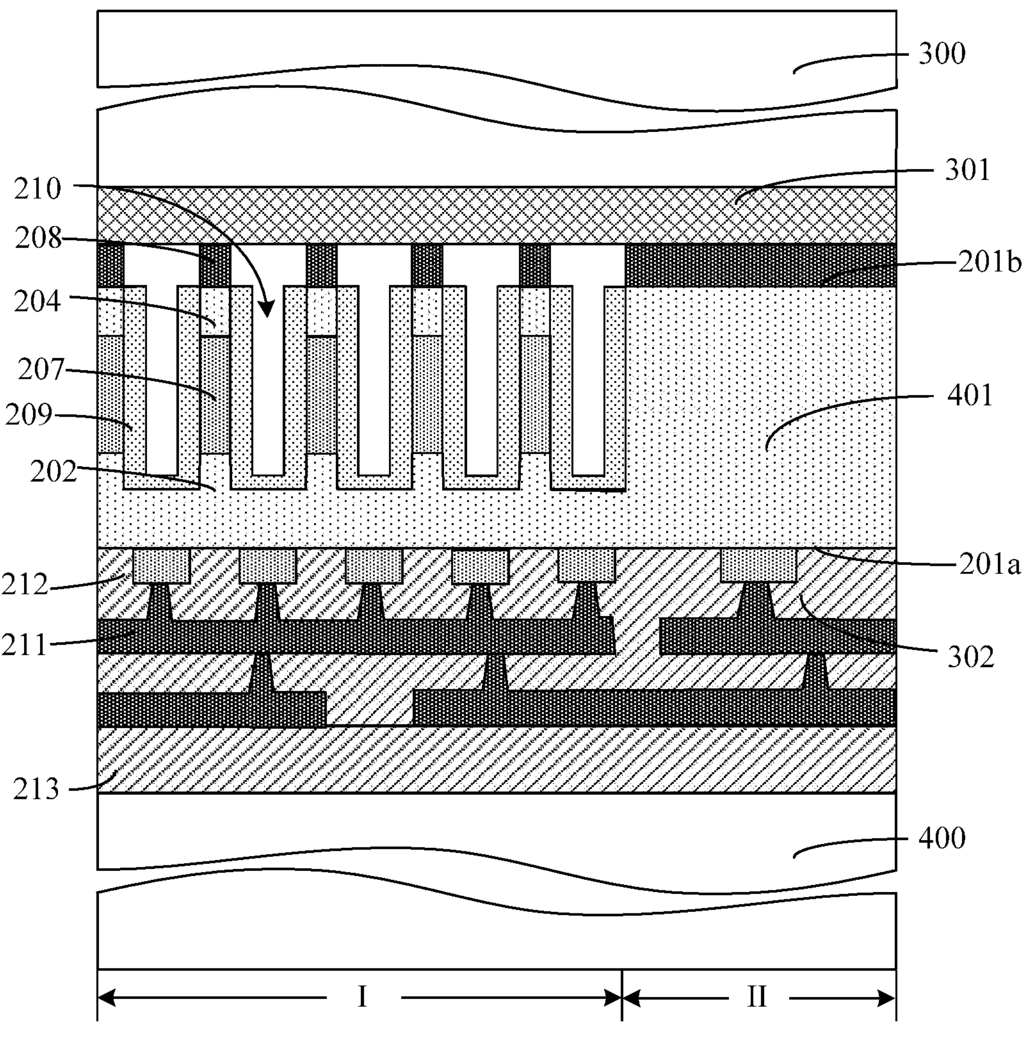

Referring to FIG. 8, after the device layer is formed, the third surface 201*a* is disposed to face the third substrate 400, and the photoelectric epitaxial layer is bonded to the third substrate 400.

Figure 9:
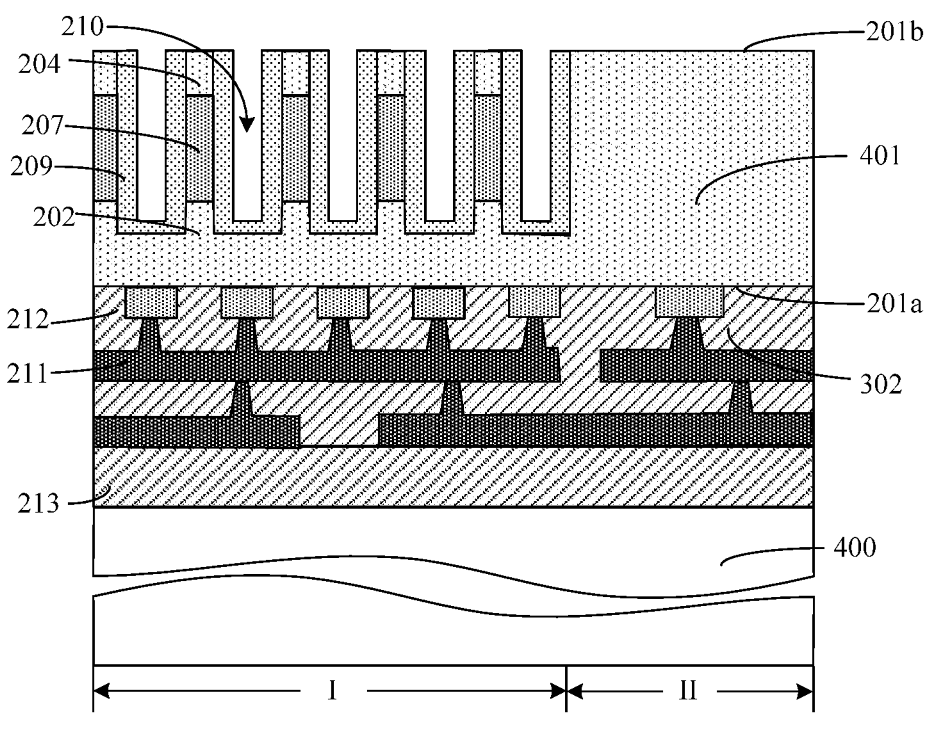

Referring to FIG. 9, after bonding the photoelectric epitaxial layer and the third substrate 400, the second substrate 300 is removed so that the fourth surface 201*b* is exposed.

In some embodiments, the buffer layer 301 and the mask layer 208 are also removed so that the fourth surface 201*b* and the groove 210 are exposed.

The process for removing the second substrate 300 includes one or more of a chemical mechanical grinding process and a chemical wet etching process.

In some embodiments, the process for removing the second substrate 300 includes a chemical mechanical grinding process.

Figure 10:
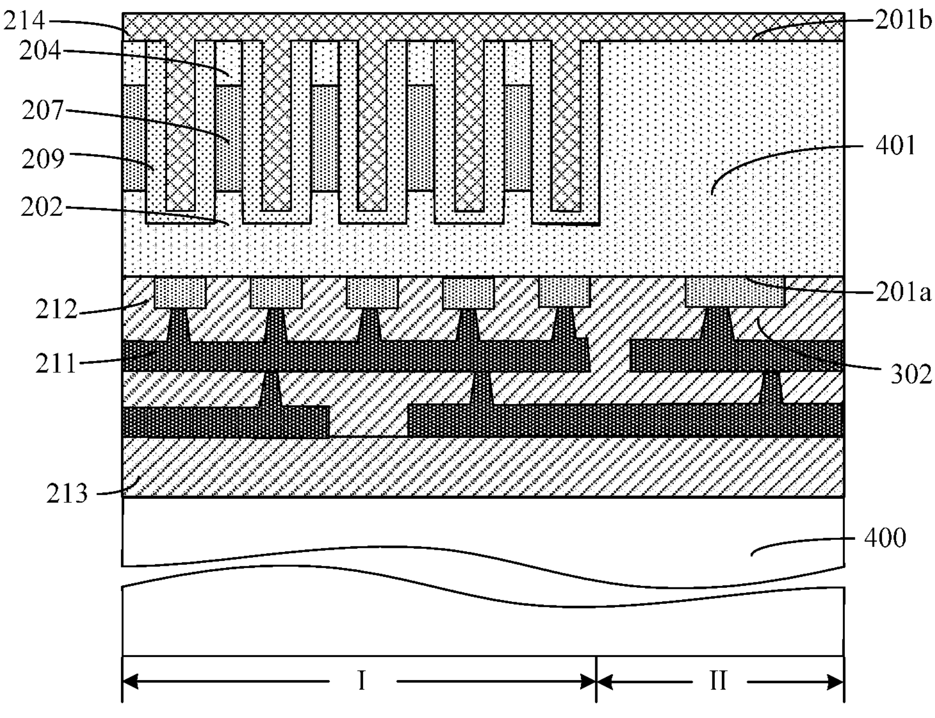

Referring to FIG. 10, an isolation layer 214 is formed in the groove 210.

The material of the isolation layer 214 includes one or more selected from a group consisting of silicon oxide, silicon nitride, silicon oxynitride, silicon oxycarbide, silicon carbonitride and silicon oxycarbonitride. In some embodiments, the material of the isolation layer 214 is silicon oxide. The isolation layer 214 may be used to form isolation between photodiode devices.

In some embodiments, after the second substrate 300 is removed to expose the fourth surface 201*b* and the groove 210, the isolation layer 214 is formed in the groove 210. In other embodiments, the isolation layer may be formed in the groove after the groove is formed and before the photoelectric epitaxial layer and the second substrate are bonded.

Figure 11:
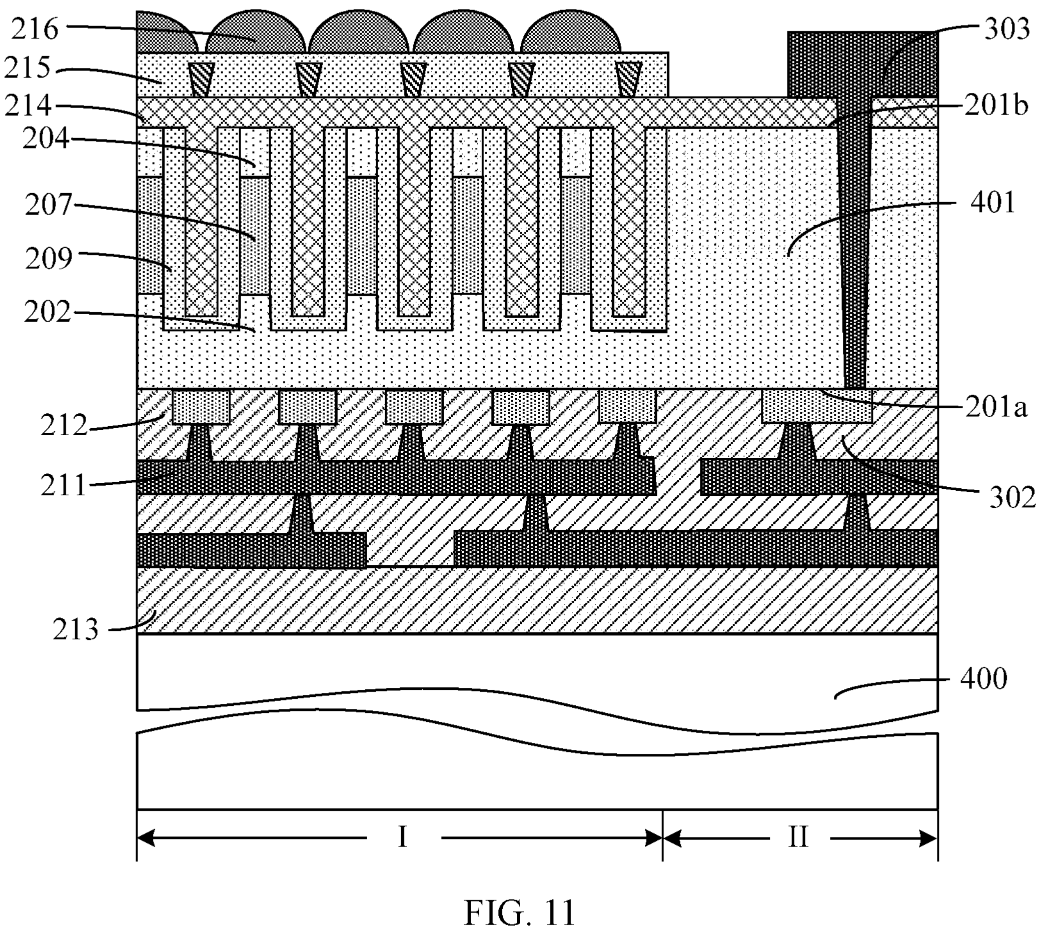

Referring to FIG. 11, after the fourth surface 201*b* is exposed, a filter layer 215 is formed on the fourth surface 201*b* and the isolation layer 214, and a plurality of lenses 216 are formed on a surface of the filter 215.

In some embodiments, specifically, after the isolation layer 214 is formed, the filter layer 215 is formed on the fourth surface 201*b* and the isolation layer 214, and the plurality of lenses 216 are formed on the surface of the filter 215.

In some embodiments, a conductive layer 303 is also formed on the fourth surface 201*b* in the second area, and the conductive layer 303 is electrically coupled with the electrical interconnection structure 211.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

What we claim is:

1. A method for forming a backside illumination CMOS image sensor, comprising:
- providing a first substrate, wherein the first substrate has a first surface and a second surface opposite to each other;
- forming a photoelectric epitaxial layer on the second surface, wherein the photoelectric epitaxial layer has a third surface and a fourth surface opposite to each other, and the second surface is adjacent to the third surface, wherein the photoelectric epitaxial layer comprises a groove extending from the fourth surface to the third surface, and the photoelectric epitaxial layer comprises a plurality of first doped areas and a plurality of second doped areas surrounding the plurality of first doped areas respectively;
- forming a device layer after forming the groove and the photoelectric epitaxial layer;
- forming an isolation layer in the groove;
- providing a second substrate and a third substrate;
- disposing the fourth surface to face the second substrate and bonding the photoelectric epitaxial layer and the second substrate after forming the groove and the photoelectric epitaxial layer and before forming the device layer;
- disposing the third surface to face the third substrate and bonding the photoelectric epitaxial layer and the third substrate after forming the device layer;
- removing the second substrate to expose the fourth surface after bonding the photoelectric epitaxial layer and the third substrate; and
- forming a filter layer on the fourth surface and the isolation layer and a plurality of lenses on a surface of the filter layer after exposing the fourth surface.

2. The method according to claim 1, wherein forming the photoelectric epitaxial layer and the groove comprises:
- forming an initial doped layer on the second surface, wherein the initial doped layer comprises a first doped material layer, a second doped material layer on the first doped material layer and a third doped material layer on the second doped material layer, the first doped material layer and the third doped material layer have a first conductive type, and the second doped material layer has a second conductive type different from the first conductive type;
- etching the initial doped layer until the first doped material layer is exposed to form an initial groove in the initial doped layer and to form the plurality of first doped areas by the second doped material layer; and
- forming a doped epitaxial layer on a side wall and a bottom surface of the initial groove to form the groove by the initial groove and to form the plurality of second doped areas by the doped epitaxial layer, the first doped material layer and the third doped material layer.

3. The method according to claim 2, wherein the doped epitaxial layer is formed by an epitaxial growth process.

4. The method according to claim 2, wherein a material of the doped epitaxial layer has doping ions, and a conductive type of the doping ions is the same as a conductive type of the second doped material layer.

5. The method according to claim 2, wherein the initial groove is formed by a dry etching process.

6. The method according to claim 5, wherein forming the initial groove comprises: forming a mask layer on a surface of the initial doped layer from which a part of the initial doped layer is exposed, and etching the initial doped layer with the mask layer as a mask.

7. The method according to claim 6, wherein the mask layer is made of a material comprising a photoresist or a dielectric material, and the dielectric material comprises one or more selected from a group consisting of silicon oxide, silicon nitride, silicon oxynitride, silicon oxycarbide, silicon carbonitride, and silicon oxycarbonitride.

8. The method according to claim 5, wherein the initial groove is formed by a thermal annealing process after the dry etching process.

9. The method according to claim 5, further comprising: performing an oxidizing process on the side wall and the bottom surface of the initial groove to form a thin oxygen layer after forming the initial groove and before forming the doped epitaxial layer.

10. The method according to claim 1, wherein bonding the photoelectric epitaxial layer and the second substrate comprises:

forming a buffer layer on a surface of the second substrate; and disposing the fourth surface to face a surface of the buffer layer of the second substrate and bonding the photoelectric epitaxial layer and the second substrate.

11. The method according to claim 10, wherein the buffer layer is made of silicon oxide or silicon nitride.

12. The method according to claim 1, further comprising: performing a thinning process on the first substrate and the photoelectric epitaxial layer from the first surface after bonding the photoelectric epitaxial layer and the second substrate and before forming the device layer.

13. The method according to claim 12, wherein the thinning process comprises one or more selected from a group consisting of a chemical wet etching process and a chemical mechanical grinding process.

14. The method according to claim 12, wherein the thinning process is performed on the first substrate and the photoelectric epitaxial layer from the first surface until the photoelectric epitaxial layer is exposed, and a thickness of the photoelectric epitaxial layer ranges from 2 μm to 6 μm.

15. The method according to claim 1, wherein a depth of the groove in a normal direction of a surface of the first substrate ranges from 0.5 μm to 3 μm, and a width of the groove in a direction parallel to the surface of the first substrate ranges from 0.1 μm to 1 μm.

16. The method according to claim 1, wherein removing the second substrate comprises one or more selected from a group consisting of a chemical wet etching process and a chemical mechanical grinding process.

17. The method according to claim 1, wherein a surface of an electrical interconnection structure is exposed from a surface of the device layer, and the method further comprise: forming a dielectric material layer on the surface of the electric interconnection structure and flattening the dielectric material layer by a chemical mechanical grinding process before bonding the photoelectric epitaxial layer and the third substrate.

18. The method according to claim 1, further comprising: aligning the device layer and the groove in relative positions on the third surface.

19. The method according to claim 1, wherein the photoelectric epitaxial layer comprises a first area and a second area, the groove is disposed in the first area, and the method further comprises: forming a peripheral device on the third surface in the second area.

* * * * *